United States Patent

Nagai et al.

[11] Patent Number: 5,889,806
[45] Date of Patent: Mar. 30, 1999

[54] GROUP III NITRIDE COMPOUND SEMICONDUCTOR LASER DIODES

[75] Inventors: Seiji Nagai; Shiro Yamasaki; Masayoshi Koike; Kazuyoshi Tomita; Tetsu Kachi; Isamu Akasaki; Hiroshi Amano, all of Aichi-ken, Japan

[73] Assignee: Toyoda Gosei Co., Ltd., Aichi, Japan

[21] Appl. No.: 908,938

[22] Filed: Aug. 8, 1997

[30] Foreign Application Priority Data

Aug. 8, 1996 [JP] Japan ................................. 8-227890

[51] Int. Cl.$^6$ ........................................................ H01S 3/19
[52] U.S. Cl. ............................................. 372/45; 372/44
[58] Field of Search .......................... 372/45, 44; 257/76, 257/77

[56] References Cited

U.S. PATENT DOCUMENTS

| | | | |
|---|---|---|---|
| 5,432,808 | 7/1995 | Hatano et al. | 372/45 |
| 5,530,267 | 6/1996 | Brandle, Jr. et al. | 257/76 |
| 5,592,501 | 1/1997 | Edmond et al. | 372/45 |
| 5,777,350 | 7/1998 | Nakamura et al. | 372/45 |

OTHER PUBLICATIONS

Nakamura et al: "InGaN Multi–Quantum–Well–Structure Laser Diodes with Cleaved Mirror Cavity Facets", Japanese Journal of Applied Physics, vol. 35 (1996) pp. L217–220.

*Primary Examiner*—Rodney Bovernick
*Assistant Examiner*—Quyen P. Leung
*Attorney, Agent, or Firm*—Pillsbury Madison & Sutro

[57] ABSTRACT

A laser diode using Group III nitride compound semiconductor consists of $In_{0.2}Ga_{0.8}N/GaN$ SQW active layer 5, a pair of GaN guide layers 41 and 62, sandwiching the active layer with wider forbidden band than the active layer, and a pair of $Al_{0.08}Ga_{0.92}N$ cladding layer 4 and 71, sandwiching a pair of the guide layers, and the LD confines carriers and light separately. $Al_{0.15}Ga_{0.75}N$ stopper layers 41 and 62 with wider forbidden band than the guide layers are formed in some portion of each of the guide layers 41 and 62 in parallel to the active layer. As a result, carriers are confined in the active layer and the laser output of the LD is improved.

7 Claims, 5 Drawing Sheets

F I G. 3
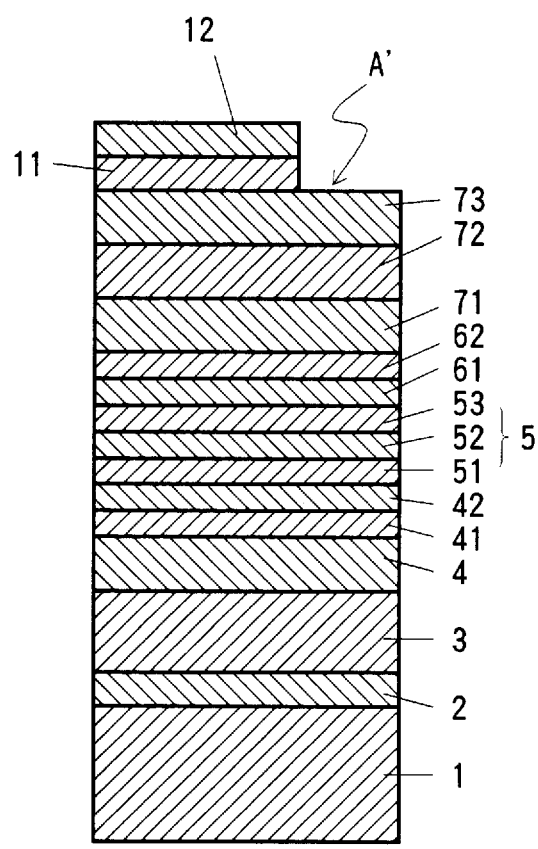

GROUP III NITRIDE COMPOUND SEMICONDUCTOR LASER DIODES

BACKGROUND OF THE INVENTION

1. Field of the Invention

The present invention relates to a group III nitride compound semiconductor laser diode (LD hereinafter). In particular, the present invention relates to an LD with improved oscillation efficiency.

2. Description of the Related Art

It has been known that an aluminum gallium indium nitride (AlGaInN) compound semiconductor may be used as a material of LD which emits blue or ultra violet light in short wavelength region. The semiconductor device is useful because of its high luminous efficiency resulting from direct electron transition and because of its ability to emit blue light, which is one of the three primary colors, or green light.

An AlGaInN compound semiconductor with p-type conduction can be obtained by doping magnesium (Mg) and irradiating an electron beam thereto or carrying out heat treatment thereto. As a result, an LD with a double heterojunction structure which includes a p-type cladding layer (AlGaN), an active layer made of indium gallium nitride (InGaN), and an n-type cladding layer made of gallium nitride (GaN) is proposed.

Further, an LD with a separate confinement heterostrucure (SCH) is proposed which separates region for confining carriers from that for confining light and additionally includes layers for confining light only because a conventional LD has difficulties in confining light within a thin active layer only. Namely, the LD with a SCH has an active layer, a pair of guide layers, and a pair of cladding layers. The active layer is formed between the pair of guide layers. The pair of guide layers are formed between the pair of cladding layers. Carriers are confined within the active layer and light is confined within the active layer and the pair of guide layers.

In order to increase the output power of the LD with SCH, it is necessary to increase amount of carrier injected into the active layer. It, however, incurs another problem that carriers cannot be confined within the thin active layer and overflow into the guide layers. As a result, output power of the LD is not high enough.

SUMMARY OF THE INVENTION

It is therefore an object of the present invention to confine carriers in an active layer for improving output power of an LD.

A laser diode using Group III nitride compound semiconductor at least having an active layer, a pair of guide layers sandwiching the active layer with wider forbidden band than the active layer, a pair of cladding layers sandwiching the pair of guide layers confining carriers and light separately, further having a stopper layer formed in some portion of each of the pair of guide layers in parallel to the active layer and wherein the stopper layer is made of mixed crystal ratio of the Group III nitride compound having a wider forbidden band than the pair of guide layers.

Because of the stopper layers formed on both sides of the active layer, carriers injected into the active layer are confined therein effectively, enabling to increase output power.

According to the second aspect of the present invention, carriers are confined effectively in the active layer, because the stopper layers are formed adjacent to the active layer contacting thereto.

According to the third aspect of the present invention, forming a stopper layer in each of the pair of guide layers, realizes selecting range for confining carriers arbitrary and flexibly. Here, in contrast to the second aspect of the present invention, the pair of stopper layers of the third aspect of the present invention, are formed in parallel to the active layer and are not necessarily touching the active layer. And that makes the range of confining carriers arbitrary and flexibly.

According to the fourth aspect of the present invention, carriers are effectively confined in the active layer by forming the stopper layers in the range of 50 Å to 500 Å thickness.

According to the fifth aspect of the present invention, the output power of an LD is improved by forming the active layer with a SQW or MQW structure.

According to the sixth aspect of the invention, the laser which emits light in short to long wavelength region is obtained by using the Group III nitride compound semiconductor satisfying the formula $(Al_xGa_{1-x})_yIn_{1-y}N$, where $0 \leq x \leq 1$, and $0 \leq y1 \leq 1$.

According to the seventh aspect of the present invention, forming the active layer satisfying the formula $In_{x1}Ga_{1-x1}N$ where $0 \leq x1 \leq 1$ and the pair of stopper layers satisfying the formula $Al_{x2}Ga_{1-x2}N$ where $0.1 \leq x2 \leq 0.3$, realize sandwiching the active layer by the pair of stopper layers which have wider forbidden band than the active layer. As a result, output power of the LD in the short to long wavelength region is improved.

Other objects, features, and characteristics of the present invention will become apparent upon consideration of the following description in the appended claims with reference to the accompanying drawings, all of which form a part of the specification, and wherein referenced numerals designate corresponding parts in the various figures.

BRIEF DESCRIPTION OF THE DRAWING

In the accompanying drawings:

FIGS. 2 to 4 are sectional views illustrating successive steps of manufacturing the LD;

DETAILED DESCRIPTION OF THE PREFERRED EMBODIMENT

The invention will be more fully understood by reference to the following embodiment, but not limited thereto.

Figure 1:
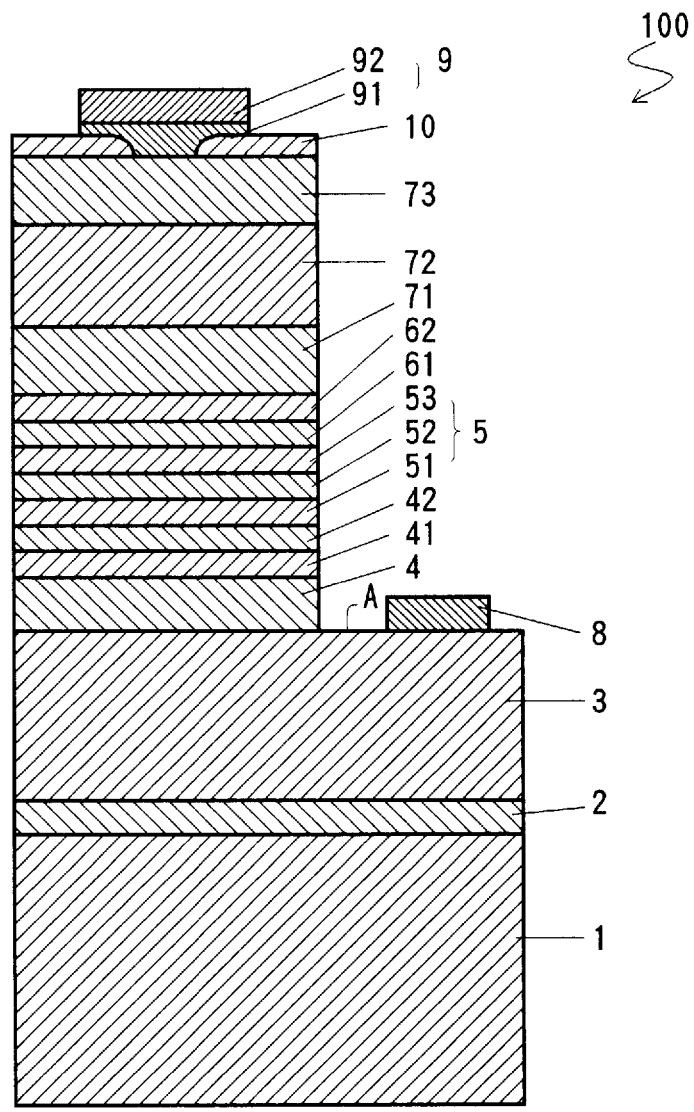
FIG. 1 is a sectional view illustrating the structure of an LD in the example set forth below.

FIG. 1 shows a whole structure of an LD 100 in this embodiment. The LD 100 has a sapphire substrate 1 on which about 0.05 μm in thickness of aluminum nitride (AlN) buffer layer 2 is formed. Ten semiconductor layers are consecutively formed on the buffer layer 2: about 4.0 μm in thickness of silicon (Si) doped gallium nitride (GaN) layer 3 of high carrier concentration ($n^+$-type), having an electron concentration of $2 \times 10^{18}/cm^3$; about 1.0 μm in thickness of Si-doped n-$Al_{0.08}Ga_{0.92}N$ cladding layer 4 of n-type, having an electron concentration of $5 \times 10^{17}/cm^3$; about 0.1 μm in thickness of Si-doped n-GaN guide layer 41, having an electron concentration of $5 \times 10^{17}/cm^3$; about 200 Å in thickness of Si-doped n-$Al_{0.15}Ga_{0.85}N$ stopper layer 42, having an electron concentration of $5 \times 10^{17}/cm^3$; an active layer 5 with a single-quantum well structure (SQW), which includes about 50 Å thickness of GaN barrier layer 51, about 50 Å thickness of $In_{0.2}Ga_{0.8}N$ well layer 52 and about 50 Å thickness of GaN barrier layer 53; about 200 Å thickness of p-$Al_{0.15}Ga_{0.85}N$ stopper layer 61, having a hole concentration of $2\times10^{17}/cm^3$ and having an Mg concentration of $5\times10^{19}/cm^3$; about 0.1 µm thickness of p-GaN guide layer 62, having a hole concentration of $2\times10^{17}/cm^3$ and having an Mg concentration of $5\times10^{19}/cm^3$; about 1 µm thickness of p-$Al_{0.08}Ga_{0.92}N$ cladding layer 71, having a hole concentration of $2\times10^{17}/cm^3$ and having an Mg concentration of $5\times10^{19}/cm^3$; about 200 nm thickness of p-GaN contact layer 72 as the first contact layer, having a hole concentration of $3\times10^{17}/cm^3$ and having an Mg concentration of $5\times10^{19}/cm^3$; and about 100 nm thickness of $p^+$-GaN contact layer 73 as the second contact layer, having a hole concentration of $6\times10^{17}/cm^3$ and having an Mg concentration of $1\times10^{20}/cm^3$. An insulating film 10 of $SiO_2$ is formed on the contact layer 73 and has a window through which electrode layer 9 including Ni and Al was formed in contact with the contact layer 73. An Al electrode layer 8 is formed on some portion of the $n^+$ layer 3.

A method for manufacturing the LD 100 is explained hereinafter. Each of the semiconductor layers of the LD 100 was formed by gaseous phase epitaxial growth, called metal organic vapor phase deposition (hereinafter MOVPE).

The gases employed in this process were ammonia ($NH_3$), a carrier gas ($H_2$ or $N_2$), trimethyl gallium ($Ga(CH_3)_3$) (hereinafter TMG), trimethyl aluminum ($Al(CH_3)_3$) (hereinafter TMA), trimethyl indium ($In(CH_3)_3$) (hereinafter TMI), silane ($SiH_4$), and biscyclopentadienyl magnesium ($Mg(C_5H_5)_2$) (hereinafter $CP_2Mg$).

The single crystalline sapphire substrate 1 was placed on a susceptor in a reaction chamber for the MOVPE treatment after its main surface 'a' was cleaned by an organic washing solvent and heat treatment. Then the sapphire substrate 1 was baked for about 30 min. at 1100° C. by $H_2$ vapor fed into the chamber at a flow rate of 2 liter/min. under normal pressure.

About 0.05 µm in thickness of AlN buffer layer 2 was formed on the surface 'a' of the baked sapphire substrate 1 under conditions controlled by lowering the temperature in the chamber to 400° C., keeping the temperature constant, and concurrently supplying $H_2$ at a flow rate of 20 liter/min., $NH_3$ at 10 liter/min., and TMA at $1.8\times10^{-5}$ mol/min for about 90 seconds.

About 4.0 µm in thickness of Si-doped GaN was formed on the buffer layer 2, as an $n^+$-layer 3 of high carrier concentration with an Si concentration of about $4\times10^{18}/cm^3$ and an electron concentration of about $1\times10^{18}/cm^3$, under conditions controlled by keeping the temperature of the sapphire substrate 1 at 1150° C. and concurrently supplying for 40 min. $H_2$ at a flow rate of 20 liter/min., $NH_3$ at 10 liter/min., TMG at $1.7\times10^{-4}$ mol/min., and silane diluted to 0.86 ppm by $H_2$ at $20\times10^{-8}$ mol/min.

About 1.0 µm in thickness of Si-doped $Al_{0.08}Ga_{0.92}N$ was formed on the $n^+$-layer 3, as a cladding layer 4 with an Si concentration of about $1\times10^{18}/cm^3$, under conditions controlled by keeping the temperature of the sapphire substrate 1 at 1100° C. and concurrently supplying for 60 min. $N_2$ or $H_2$ at a flow rate of 10 liter/min., $NH_3$ at 10 liter/min., TMG at $1.12\times10^{-4}$ mol/min., TMA at $0.47\times10^{-4}$ mol/min., and silane diluted to 0.86 ppm by $H_2$ at $10\times10^{-9}$ mol/min.

About 0.1 µm in thickness of n-GaN was formed on the cladding layer 4 as a guide layer 41 with an electron concentration of about $5\times10^{17}/cm^3$ and an Si concentration of about $1\times10^{18}/cm^3$, under conditions controlled by keeping the temperature of the sapphire substrate 1 at 1100° C. and concurrently supplying for 5 min. $H_2$ at a flow rate of 20 liter/min., $NH_3$ at 10 liter/min., TMG at $1.12\times10^{-4}$ mol/min., and silane diluted to 0.86 ppm by $H_2$ at $10\times10^{-9}$ mol/min.

About 200 Å in thickness of Si-doped n-$Al_{0.15}Ga_{0.85}N$, serving as a stopper layer 42 with an Si concentration of about $1\times10^{18}/cm^3$, was formed on the guide layer 41 under conditions controlled by keeping the temperature of the sapphire substrate 1 at 1100° C. and concurrently supplying for 1.2 min. $N_2$ or $H_2$ at a flow rate of 10 liter/min., $NH_3$ at 10 liter/min., TMG at $2.24\times10^{-4}$ mol/min., TMA at $0.24\times10^{-4}$ mol/min., and silane diluted to 0.86 ppm by $H_2$ at $10\times10^{-9}$ mol/min.

Then, about 150 Å SQW structure including a barrier layer 51, a well layer 52, and a barrier layer 53, serving as an active layer 5 was formed.

About 50 Å in thickness of GaN, serving as a barrier layer 51, was formed on the stopper layer 42 under conditions controlled by keeping the temperature of the sapphire substrate 1 at 800° C. and concurrently supplying for 1.5 min. $N_2$ or $H_2$ at a flow rate of 20 liter/min., $NH_3$ at 10 liter/min., and TMG at $2.0\times10^{-4}$ mol/min.

About 50 Å in thickness of $In_{0.2}Ga_{0.8}N$, serving as a well layer 52, was formed on the barrier layer 51 under conditions controlled by keeping the temperature of the sapphire substrate 1 at 800° C. and concurrently supplying for 1.5 min. $N_2$ or $H_2$ and $NH_3$ at the same flow rate as those of the barrier layer 51, TMG at $7.2\times10^{-5}$ mol/min., and TMI at $0.19\times10^{-4}$ mol/min.

The barrier layer 53 was formed on the well layer 52 under the same conditions as the barrier layer 51.

About 200 Å in thickness of Mg-doped p-$Al_{0.15}Ga_{0.85}N$ was formed on the active layer 5, as a stopper layer 61 with a Mg concentration of about $5\times10^{19}/cm^3$, under conditions controlled by keeping the temperature of the sapphire substrate 1 at 1100° C. and concurrently supplying for 1.2 min. $N_2$ or $H_2$ at a flow rate of 10 liter/min., $NH_3$ at 10 liter/min., TMG at $2.24\times10^{-4}$ mol/min., TMA at $0.24\times10^{-4}$ mol/min., and $CP_2Mg$ at $2\times10^{-5}$ mol/min.

About 0.1 µm in thickness of Mg-doped p-GaN, serving as a guide layer 62 with an Mg concentration of about $5\times10^{19}/cm^3$, was formed on the stopper layer 61, under conditions controlled by keeping the temperature of the sapphire substrate 1 at 1100° C. and concurrently supplying for 5 min. $H_2$ at a flow rate of 20 liter/min., $NH_3$ at 10 liter/min., TMG at $1.12\times10^{-4}$ mol/min., and $CP_2Mg$ at $2\times10^{-5}$ mol/min.

About 1.0 µm thickness of Mg-doped p-$Al_{0.08}Ga_{0.92}N$ was formed on the guide layer 62, as a cladding layer 71 with Mg concentration of about $5\times10^{19}/cm^3$, under conditions controlled by keeping the temperature of the sapphire substrate 1 at 1100° C. and concurrently supplying for 60 min. $N_2$ or $H_2$ at a flow rate of 10 liter/min., $NH_3$ at 10 liter/min., TMG $1.12\times10^{-4}$ mol/min., TMA at $0.47\times10^{-4}$ mol/min., and $CP_2Mg$ at $2\times10^{-5}$ mol/min.

About 200 nm thickness of Mg-doped GaN was formed on the cladding layer 71, as the first contact layer 72 under conditions controlled by keeping the temperature 1100° C. and concurrently supplying for 1 min. $N_2$ or $H_2$ at a flow rate of 20 liter/min., $NH_3$ at 10 liter/min., TMG at $1.12\times10^{-4}$ mol/min., and $CP_2Mg$ at $2\times10^{-5}$ mol/min. The impurity concentration of Mg doped into the contact layer 72 was $5\times10^{19}/cm^3$.

About 100 nm thickness of Mg-doped GaN was formed on the first contact layer 72, as a second $p^+$ contact layer 73 under conditions controlled by keeping the temperature 1100° C. for 30 sec. $N_2$ or $H_2$ at a flow rate of 20 liter/min., $NH_3$ at 10 liter/min., TMG at $1.12\times10^{-4}$ mol/min., and $CP_2Mg$ at $4\times10^{-5}$ mol/min. The impurity concentration of Mg doped into the second contact layer 73 was $1\times10^{20}/cm^3$.

At this stage, the resistivity of each of the stopper layer 61, the guide layer 62, cladding layer 71, the first contact layer 72 and the second contact layer 73 was $10^8$ Ω·cm or more, exhibiting insulating characteristics.

Then, electron rays were uniformly irradiated into the insulative five layers using a reflective electron beam diffraction device. The irradiation conditions were set at 10 kV for the accelerating voltage, 1 μA for the sample current, 0.2 mm/sec. for the speed of the beam scanning, 60 μm φ for the beam aperture, and at $5.0 \times 10^{-5}$ Torr vacuum. This irradiation changed the insulative five layers, or the second contact layer 73, the first contact layer 72, the cladding layer 71, the guide layer 62 and the stopper layer 61, to each be a p-type conductive semiconductor with respective hole concentrations of $6 \times 10^{17}/cm^3$, $3 \times 10^{17}/cm^3$, $2 \times 10^{17}/cm^3$, $2 \times 10^{17}/cm^3$, and $2 \times 10^{17}/cm^3$, and respective resistivities of 2 Ω·cm, 1 Ω·cm, 0.7 Ω·cm, 0.7 Ω·cm and 0.7 Ω·cm. As a result, a wafer with a multiple layer structure was obtained.

Figure 2:
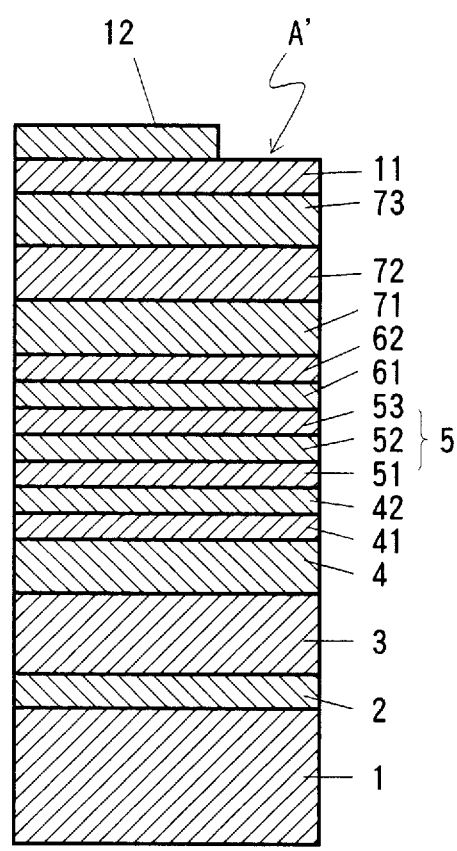
Figure 4:
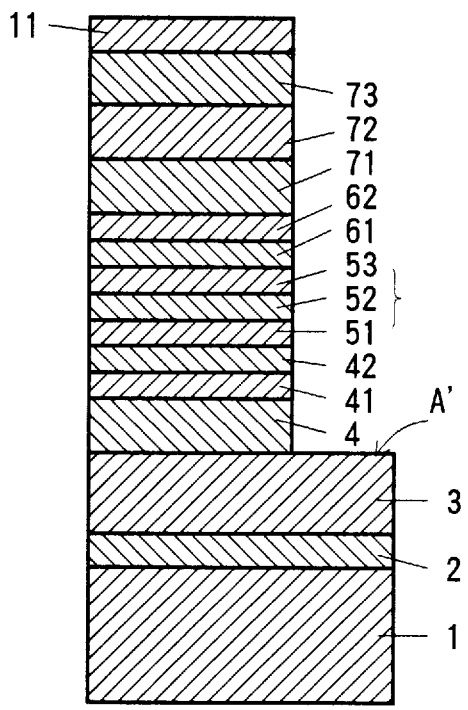

Then, electrodes 8 and 9 were formed as follows. An electrode forming part A for the electrode 8 in contact with the $n^+$-layer 3 was formed by removing some portion of the layers from the second contact layer 73 down to the cladding layer 4 by etching as shown in FIGS. 2 to 4. Then, an $SiO_2$ insulating layer 10 was laminated on the entire surface of the wafer. A window was formed in the central portion of the $SiO_2$ layer deposited on the second contact layer 73. A Ni layer 91 and then an Au layer 92 were uniformly deposited on the insulating film 10 contacting the second contact layer 72 through the window. Through the processes of laminating a photoresist layer, patterning by photolithography, and carrying out etching, the electrode 9 was formed in contact with the second contact layer 73. The electrode 8 was formed by depositing aluminum (Al) on the exposed portion of the $n^+$-layer 3.

A wafer treated with the above-mentioned process was divided into each element and the LED 100 as shown in FIG. 1 was obtained. The obtained LD 100 was found to have an oscillation wavelength of 420 nm and an output power of which was two folds compared with a conventional LD.

Figure 5:
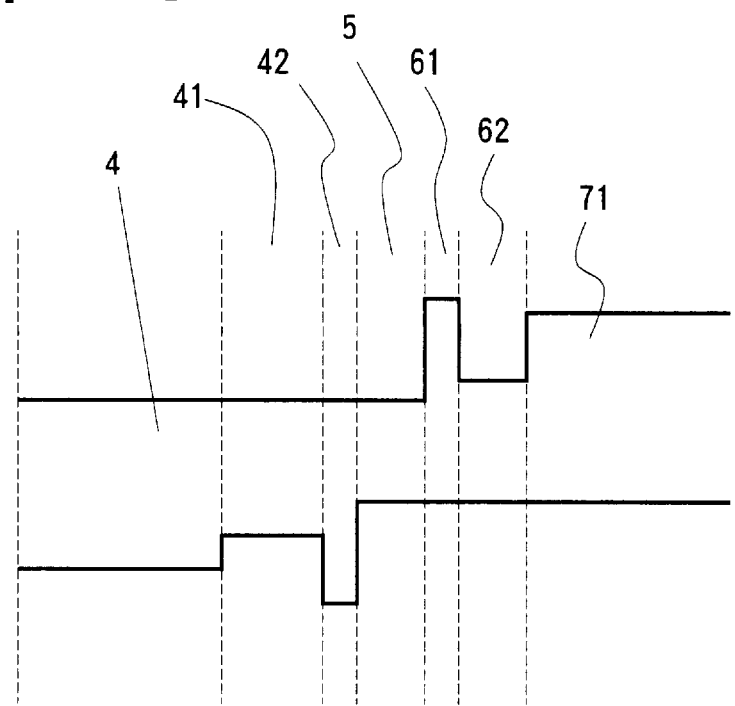
FIG. 5 is a view illustrating an energy-level diagram of the LD.

FIG. 5 shows an energy-level diagram of the LD 100. Electrons and holes injected into the active layer 5 were efficiently confined therein by means of the pair of stopper layers 42 and 61. The light emitted from the active layer 5 was confined into the pair of guide layers 62 and 41 and the active layer 5 with little leakage to the cladding layers 4 and 71.

Because resistivity of a p-type layer of a semiconductor device using AlGaInN is not low enough, high electric field is formed at the side of the p-type layer when the voltage is applied to the device to inject the carrier. Accordingly, height of barrier to electrons by the p-type layer is substantially lowered and electrons overflow even in the device with a SCH structure having a barrier adjacent to the active layer. Further, holes injected in the p-type layer are accelerated and injected into the active layer by high electric field in the p-type layer, holes also overflows beyond a barrier to holes formed adjacent to the active layer.

Figure 6:
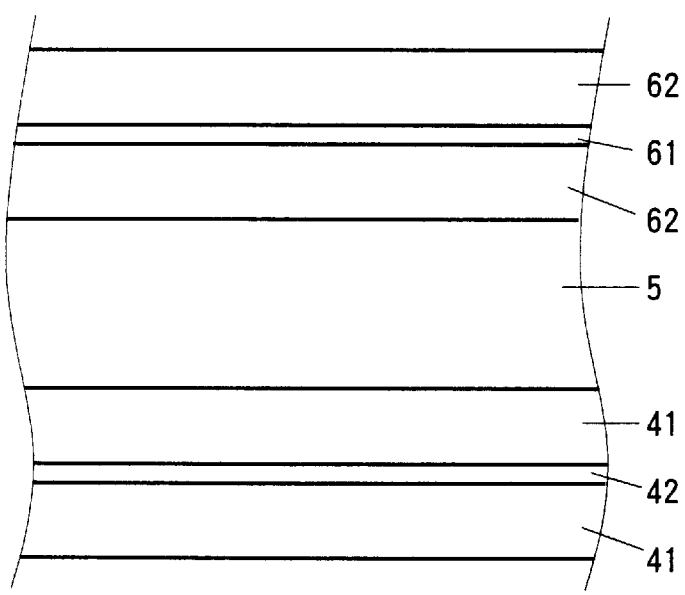
FIG. 6 is a sectional view illustrating a variation of stopper layers.

Therefore, the present invention sandwiched the active layer 5 by the pair of stopper layers 42 and 61 whose forbidden band is wider than that of the guide layers 41 and 62. The pair of stopper layers 42 and 61 prevented overflows of holes and electrons. Consequently, higher output power were gained and laser oscillation was realized in a higher temperature range by the LD 100 of the present invention. In the embodiment, the active layer 5 had a single-quantum well structure (SQW). Alternatively, the active layer 5 can have a multi-quantum well structure (MQW) or single layer structure. The pair of stopper layers 42 and 62 were formed adjacent to the active layer 5 in the embodiment. Alternatively, it can be formed in the middle of the guide layers 41 and 62 in parallel to the active layer 5, as shown in FIG. 6.

The impurity concentration of Si doped into the cladding layer 4, the guide layer 41 and the stopper layer 42 should preferably be in the range of $1 \times 10^{17}/cm^3$ to $1 \times 10^{20}/cm^3$. When it is smaller than $1 \times 10^{17}/cm^3$, resistance of the layers rises. When it is larger than $1 \times 10^{20}/cm^3$, crystallinity of the layers becomes poor.

The thickness of the stopper layers 42 and 61 should preferably be in the range of 50 Å to 500 Å. When it is smaller than 50 Å, efficiency of confirming carriers in the active layer 5 is lowered. When it is larger than 500 Å, the efficiency of light and the efficiency of injecting carriers in the active layer 5 is lowered.

The thickness of the guide layers 41 and 62 should preferably be in the range of 500 Å to 5000 Å. When it is smaller than 500 Å or larger than 5000 Å, the efficiency of confirming light is lowered.

The mixed crystal ratio of Al in the pair of stopper layers 42 and 61, made of InGaN, should preferably be in the range of 0.1 to 0.3. When it is smaller than 0.1, the barrier for the active layer 5 and the efficiency of confining carriers into the stopper layers are lowered. When it is larger than 0.3, the efficiency of injecting carriers in the active layer 5 is lowered.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A laser diode using Group III nitride compound at least comprising an active layer, a pair of guide layers sandwiching said active layer with wider forbidden band than said active layer, a pair of cladding layers sandwiching said pair of guide layers and confining carriers and light separately, further comprising:

a stopper layer formed in some portion of each of said pair of guide layers in parallel to said active layer; and wherein said stopper layer is made of mixed crystal ratio of said Group III nitride compound having a wider forbidden band than said pair of guide layers.

2. A laser diode of claim 1, wherein said stopper layer is formed adjacent to each side of said active layer.

3. A laser diode of claim 1, wherein each of said stopper layer is formed in each of said pair of guide layers without contacting said active layer.

4. A laser diode of claim 1, wherein each of said stopper layers has a thickness in the range from 50 Å to 500Å.

5. A laser diode of claim 1, wherein said active layer has at least one of single-quantum well structure (SQW) and multi-quantum well structure (MQW).

6. A laser diode of claim 1, wherein said Group III nitride compound semiconductor satisfies the formula $(Al_xGa_{1-x})_yIn_{1-y}N$ where $0 \leq x \leq 1$ and $0 \leq y \leq 1$.

7. A laser diode of claim 1, wherein said active layer satisfies the formula $In_{x1}Ga_{1-x1}N$ where $0 \leq x1 \leq 1$ and said stopper layers satisfy the formula $Al_{x2}Ga_{1-x2}N$ where $0.1 \leq x2 \leq 0.3$.

* * * * *